United States Patent [19]

Douseki

[11] Patent Number: 5,594,371
[45] Date of Patent: Jan. 14, 1997

[54] LOW VOLTAGE SOI (SILICON ON INSULATOR) LOGIC CIRCUIT

[75] Inventor: Takakuni Douseki, Atsugi, Japan

[73] Assignee: Nippon Telegraph and Telephone Corporation, Tokyo, Japan

[21] Appl. No.: 495,785

[22] Filed: Jun. 27, 1995

[30] Foreign Application Priority Data

Jun. 28, 1994 [JP] Japan .................. 6-168851
Dec. 20, 1994 [JP] Japan .................. 6-334640

[51] Int. Cl.⁶ .................. H03K 19/094; H03K 19/0175
[52] U.S. Cl. .................. 326/119; 326/122; 326/83
[58] Field of Search .................. 326/122, 119, 326/83

[56] References Cited

U.S. PATENT DOCUMENTS

| | | | |
|---|---|---|---|
| 3,914,702 | 10/1975 | Gehweiler | 326/121 |
| 4,906,587 | 7/1988 | Blake | 437/41 |
| 5,373,199 | 12/1994 | Shichinohe et al. | 326/83 |
| 5,382,844 | 1/1995 | Knauer | 326/121 |
| 5,479,107 | 12/1995 | Knauer | 326/121 |

FOREIGN PATENT DOCUMENTS

| | | |
|---|---|---|
| 62-264670 | 5/1988 | Japan . |
| 06029834 | 5/1994 | Japan . |
| 6-237164 | 8/1994 | Japan . |
| 7-182869 | 7/1995 | Japan . |
| 8-17183 | 1/1996 | Japan . |

OTHER PUBLICATIONS

Sixth Annual IEEE International ASIC Conference and Exhibit, Proceedings, 1993, pp. 186–189, Mutoh et al, "1V High-Speed Digital Circuit Technology with 0.5 μm Multi-Threshold CMO's".

1989 IEEE SOS/SOI Technology Conference, Oct. 3, 1989, Nevada USA, pp. 128–129, XP000167665 Matloubian et al, "Smart Body Contact for SOI MOSFETs".

IEEE, International Electron Device Meeting, 1994 San Francisco, California, USA, pp. 79–82, T. Andoh et al, "Design Methodology for Low-Voltage MOSFETs".

"Selection of Operation Mode on SOI/MOSFET's For High--Resistivity Load Static Memory Cell", Y. Yamaguchi et al, IEEE 1993, pp. 94–95.

"Switched–Source–Impedance CMOS Circuit For Low Standby Subthreshold Current Giga-Scale LSI's", M. Horiguchi, et al, IEEE Journal of Solid-State Circuits, vol. 28, No. 11, Nov. 1993, pp. 1131–1135.

"Design Methodology For Low-Voltage MOSFETs", T. Andoh, et al, IEEE 1994, pp. 79–81.

"An SOI-DRAM With Wide Operating Voltage Range by CMOS/SIMOX Technology", K. Suma, et al; IEEE 1994, pp. 138–139, 324.

*Primary Examiner*—Edward P. Westin
*Assistant Examiner*—Richard Roseen
*Attorney, Agent, or Firm*—Frishauf, Holtz, Goodman, Langer & Chick, P.C.

[57] ABSTRACT

A SOI (Silicon On Insulator) logic circuit including serially connected power switching SOI MOSFETs (44, 45) and a logic circuit (43) constituted by SOI MOSFETs. The bodies of the MOSFETs of the logic circuit are made floating state, thereby implementing low threshold voltage MOSFETs. The bodies of the power switching MOSFETs are biased to power supply potentials, thereby implementing high threshold MOSFETs. The low threshold voltage MOSFETs enable the logic circuit to operate at a high speed in an active mode, and the high threshold voltage power switching MOSFETs can reduce the power dissipation in a sleep mode.

16 Claims, 14 Drawing Sheets

5,594,371

LOW VOLTAGE SOI (SILICON ON INSULATOR) LOGIC CIRCUIT

BACKGROUND OF THE INVENTION

1. Field of the Invention

The present invention relates to a low voltage SOI (Silicon On Insulator) logic circuit using a SOI field effect transistor operable by 1 V dry battery.

2. Description of Related Art

As a conventional low voltage logic circuit, one such as shown in FIG. 1 is known. The logic circuit employs a bulk CMOS circuit and is disclosed in Japanese patent application laying open No. 6-29834 (1994), and S. Mutoh, et al. "1 V HIGH SPEED DIGITAL CIRCUIT TECHNOLOGY WITH 0.5 μm MULTI-THRESHOLD CMOS", IEEE, 1993, pages 186–189.

This circuit has a basic arrangement, in which a CMOS logic circuit group 3 is connected between a power switching MOSFET 4 and a power switching MOSFET 5 which are connected to a high potential power supply line 1 and a low potential power supply line 2, respectively. Here, the power switching MOSFETs 4 and 5 are MOSFETs with high threshold voltage, and the logic circuit group 3 is composed of low threshold voltage MOSFETs.

The high threshold voltage power switching MOSFETs 4 and 5 are provided with a sleep signal SL and its inverted signal *SL at the gates thereof, respectively. The MOSFETs 4 and 5 are kept nonconducting by a high level signal SL in a sleep mode (during a waiting time period) of the logic circuit group 3, thereby stopping power supply to the logic circuit group 3. Reversely, the power is supplied to the logic circuit group 3 in an active mode by keeping the sleep signal SL low, thereby maintaining the MOSFETs 4 and 5 in a conducting state.

Generally, although low threshold voltage MOSFETs have characteristics of high speed operation, their leakage current in a nonconducting state is large. In contrast, although high threshold voltage MOSFETs have characteristics of low speed operation, their leakage current in a nonconducting state is small. Therefore, the circuit as shown in FIG. 1 can operate at a high speed in the active mode of the logic circuit group 3 while maintaining a small leakage current in the sleep mode.

It should be noted here that individual substrates of MOSFETs of the logic circuit group 3 are connected to the high potential power supply line 1 or the low potential power supply line 2 in the conventional low voltage logic circuit. This substrate bias is applied for preventing faulty operations due to latch up which will readily occur in bulk CMOS. Incidentally, although the substrates of MOSFETs of the logic circuit group of FIG. 1 of the above-mentioned paper of Mutoh, et al. are shown as though they were not connected to any points, this is for the simplicity of drawing, and the substrates of these MOSFETs are actually connected to respective power supply lines.

Applying such construction to a SOI CMOS logic circuit presents a problem that a device area will increase. This will be described below.

FIG. 2 is a cross-sectional view showing the structure of a conventional SOI MOSFET. A buried oxide 12 is formed on a silicon substrate 11, and an active region 13 consisting of a single crystal silicon layer is built on the buried oxide 12. The active region 13 consists of a source 131, a drain 132 and a body 132 sandwiched between them. The active region 13 is covered with a gate oxide 14, and a gate electrode 15 is formed on the gate oxide 14. By applying a voltage on the gate electrode 15, a channel 134 is formed in the top portion of the body 133. Thus, the active region 13 consists of the source 131, the drain 132 and the body 133, and the body 133 is insulated from the silicon substrate 11 by the buried oxide 12.

FIG. 3A shows a method of applying a bias to the substrate of a bulk MOSFET, and FIG. 3B shows a method of applying a bias to the body of a SOI MOSFET. In the bulk PMOSFET as shown in FIG. 3A, an N well 20 is built in the substrate, a P+ source 21 and a P+ drain 22 are formed therein, and a gate electrode 23 is formed on the top surface of the well 20 via a gate oxide. In addition, an N+ bias region 24 is formed in the well 20 in such a fashion that a potential is applied thereto through contacts 25 from the top of the silicon.

On the other hand, since the body 133 is insulated from the silicon substrate 11 as shown in FIG. 2 in a SOI PMOSFET shown in FIG. 3B, the body 133 must be extended via a connecting portion 34A to a bias region 34, in which contacts 35 are formed.

As a result, the area of the bias region increases in the SOI MOSFET as compared with the bulk MOSFET, so that the SOI MOSFET has a disadvantage that its occupied area increases by that amount. In particular, an increase in size of MOSFETs constituting the logic circuit group 3 poses a problem that it will increase the whole circuit area, and hence, reduce the degree of integration.

SUMMARY OF THE INVENTION

It is therefore an object of the present invention to provide a low voltage SOI logic circuit capable of implementing a high speed operation and a high degree of integration.

In a first aspect of the present invention, there is provided a low voltage SOI (Silicon On Insulator) logic circuit comprising:

a first power supply line;

a second power supply line;

a first SOI FET (Field Effect Transistor) whose source and body are connected to the first power supply line;

a second SOI FET whose source and body are connected to the second power supply line; and a logic circuit connected between a drain of the first SOI FET and a drain of the second SOI FET;

wherein the logic circuit is constituted by a plurality of SOI FETs whose bodies are made floating state, and a connection between the first power supply line and the logic circuit and a connection between the second power supply line and the logic circuit are switched by a signal supplied to a gate of the first SOI FET and a gate of the second SOI FET.

Here, the carrier concentration in the bodies of the SOI FETs constituting the logic circuit may be adjusted such that the bodies of the SOI FETs constituting the logic circuit are made fully depleted, and a carrier concentration in the bodies of the first SOI FET and the second SOI FET may be adjusted such that the bodies of the first SOI FET and the second SOI FET are partially depleted.

The carrier concentration in the bodies of the SOI FETs constituting the logic circuit may be adjusted such that a depletion layer width W given by the following equation (A) is equal to or greater than depth of the bodies of the SOI FETs constituting the logic circuit, and a carrier concentration in the bodies of the first SOI FET and the second SOI FET may be adjusted such that the depletion layer width W given by the following equation (A) is less than depth of the bodies of the first SOI FET and the second SOI FET.

$$W=\{2\epsilon_{si} \cdot 2\phi_f/(q \cdot N_{body})\}^{1/2} \quad (A)$$

where $\epsilon_{si}$ is the dielectric constant of silicon, $\phi_f$ is the Fermi potential of silicon, q is the charge of the electron, and $N_{body}$ is the carrier concentration in the body.

The depth of the bodies of the SOI FETs constituting the logic circuit may be made equal to or less than 100 nm, and the carrier concentration in the bodies of the SOI FETs constituting the logic circuit may be made equal to or less than $1\times10^{17}$ cm$^{-3}$ to fully deplete the bodies, and the depth of the bodies of the first SOI FET and the second SOI FET may be made equal to or less than 100 nm, and the carrier concentration in the bodies of the first SOI FET and the second SOI FET may be set greater than $1\times10^{17}$ cm$^{-3}$ to partially deplete the bodies.

In a second aspect of the present invention, there is provided a low voltage SOI (Silicon On Insulator) logic circuit comprising:

a first power supply line;

a second power supply line;

a first SOI FET (Field Effect Transistor) whose source is connected to the first power supply line, and whose body is connected to a gate of the first SOI FET;

a second SOI FET whose source is connected to the second power supply line, and whose body is connected to a gate of the second SOI FET; and a logic circuit connected between a drain of the first SOI FET and a drain of the second SOI FET;

wherein the logic circuit is constituted by a plurality of SOI FETs whose bodies are made floating state, and a connection between the first power supply line and the logic circuit and a connection between the second power supply line and the logic circuit are switched by a signal supplied to the gate of the first SOI FET and the gate of the second SOI FET.

In a third aspect of the present invention, there is provided a low voltage SOI (Silicon On Insulator) logic circuit comprising:

a first power supply line;

a second power supply line;

a power switching SOI FET (Field Effect Transistor) whose source and body are connected to the first power supply line; and a logic circuit connected between a drain of the power switching SOI FET and the second power supply line;

wherein the logic circuit is constituted by a plurality of SOI FETs whose bodies are made floating state, and a connection between the first power supply line and the logic circuit is switched by a signal supplied to a gate of the power switching SOI FET.

Here, the carrier concentration in the bodies of the SOI FETs constituting the logic circuit may be adjusted such that the bodies of the SOI FETs constituting the logic circuit are made fully depleted, and a carrier concentration in the body of the power switching SOI FET may be adjusted such that the body of the power switching SOI FET is partially depleted.

The carrier concentration in the bodies of the SOI FETs constituting the logic circuit may be adjusted such that a depletion layer width W given by the following equation (A) is equal to or greater than depth of the bodies of the SOI FETs constituting the logic circuit, and a carrier concentration in the body of the power switching SOI FET may be adjusted such that the depletion layer width W given by the following equation (A) is less than depth of the body of the power switching SOI FET.

$$W=\{2\epsilon_{si} \cdot 2\phi_f/(q \cdot N_{body})\}^{1/2} \quad (A)$$

where $\epsilon_{si}$ is the dielectric constant of silicon, $\phi_f$ is the Fermi potential of silicon, q is the charge of the electron, and $N_{body}$ is the carrier concentration in the body.

The depth of the bodies of the SOI FETs constituting the logic circuit may be made equal to or less than 100 nm, and the carrier concentration in the bodies of the SOI FETs constituting the logic circuit may be made equal to or less than $1\times10^{17}$ cm$^{-3}$ to fully deplete the bodies, and the depth of the body of the power switching SOI FET may be made equal to or less than 100 nm, and the carrier concentration of the body of the power switching SOI FET may be set greater than $1\times10^{17}$ cm$^{-3}$ to partially deplete the body.

In a fourth aspect of the present invention, there is provided low voltage SOI (Silicon On Insulator) logic circuit comprising:

a first power supply line;

a second power supply line;

a power switching SOI FET (Field Effect Transistor) whose source is connected to the first power supply line, and whose body is connected to a gate of the power switching SOI FET; and a logic circuit connected between a drain of the power switching SOI FET and the second power supply line;

wherein the logic circuit is constituted by a plurality of SOI FETs whose bodies are made floating state, and a connection between the first power supply line and the logic circuit is switched by a signal supplied to the gate of the power switching SOI FET.

The present invention is characterized in that the bodies of the SOI MOSFETs in the logic circuit are kept floating state. This makes it possible to obviate the bias regions and the connecting portions which are conventionally required, and to prevent the device area from increasing. In addition, in an NMOSFET (PMOSFET) with its body kept floating state, holes (electrons) flow from drain to body (impact ionization) and increase the potential of the body. Accordingly, the absolute value of the voltage across the body and the source increases. This makes it possible to reduce the threshold voltage of the devices, which presents an advantage that the power supply voltage to the devices for the logic circuit can be reduced.

Although the bias region and the connecting portion are required to implement a high threshold voltage in the power switching MOSFET(s), it is sufficient for the power switching MOSFET(s) to be disposed only at one (both) side(s) of the logic circuit. Accordingly, the number of the MOSFET(s) used in this circuit is very low in comparison with that of the logic circuit MOSFETs, and hence, the adverse effect on the entire area of the circuit can be nearly neglected.

In addition, adjusting the carrier concentration of the body of a MOSFET makes it possible to set its threshold voltage at higher accuracy. Specifically, in low threshold voltage MOSFETs for the logic circuit, the low threshold voltage can be implemented at high accuracy by fully depleting the body in the floating state by reducing the carrier concentration in the body. Likewise, in a high threshold voltage MOSFET(s) for the power switching, a high threshold voltage can be implemented at high accuracy by partially depleting the biased body by increasing the carrier concentration in the body.

Furthermore, the threshold voltage of the power switching MOSFET(s) can be automatically varied to a high threshold voltage during a nonconducting state, and to a low threshold voltage during a conducting state by connecting the body of the MOSFET(s) to the gate to bias the body with the gate voltage. Thus, more advantageous power control can be achieved by using the variable threshold voltage.

The above and other objects, effects, features and advantages of the present invention will become more apparent from the following description of the embodiments thereof taken in conjunction with the accompanying drawings.

DETAILED DESCRIPTION OF PREFERRED EMBODIMENTS

The invention will now be described with reference to the accompanying drawings.

EMBODIMENT 1

Figure 1:
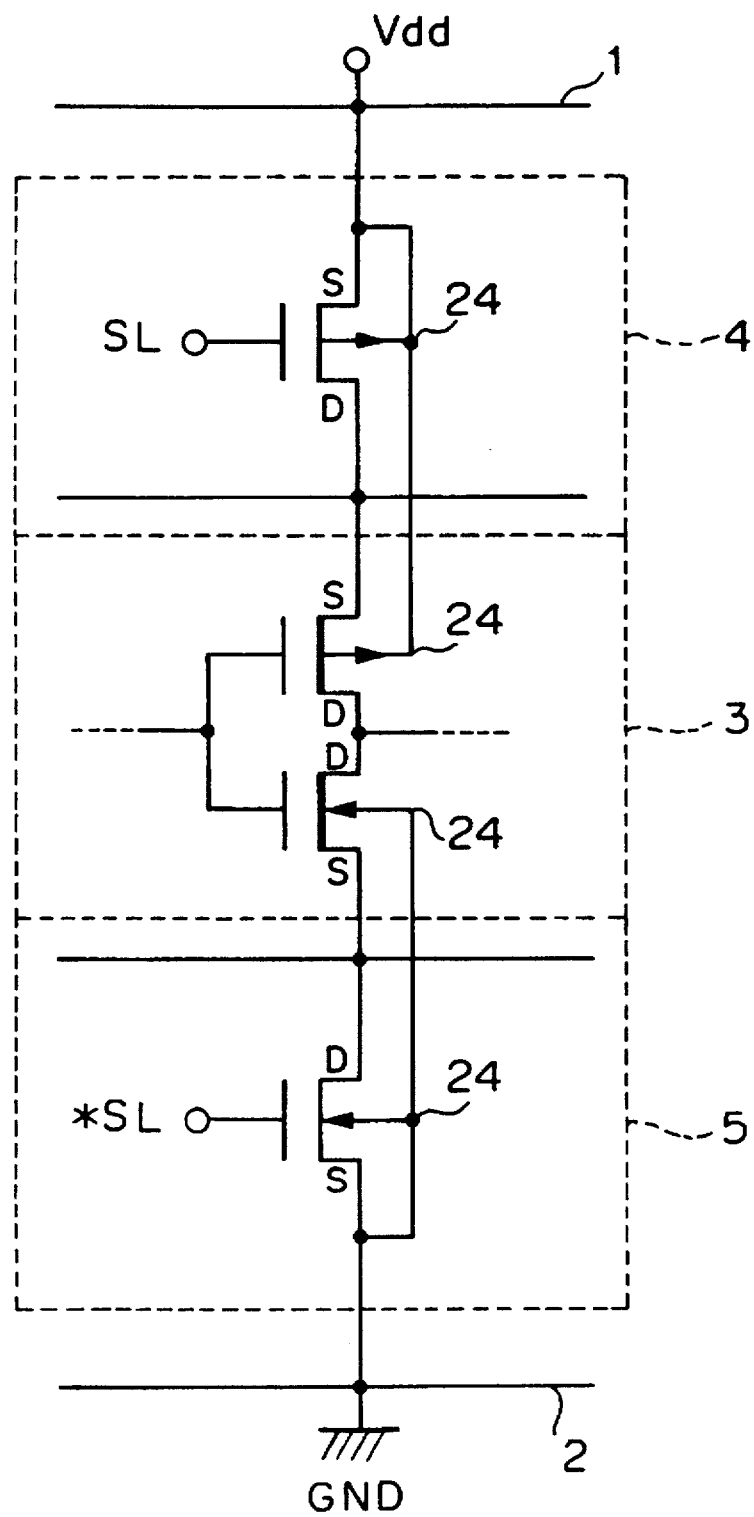
FIG. 1 is a circuit diagram showing an example of a conventional low voltage CMOS logic circuit.
Figure 2:
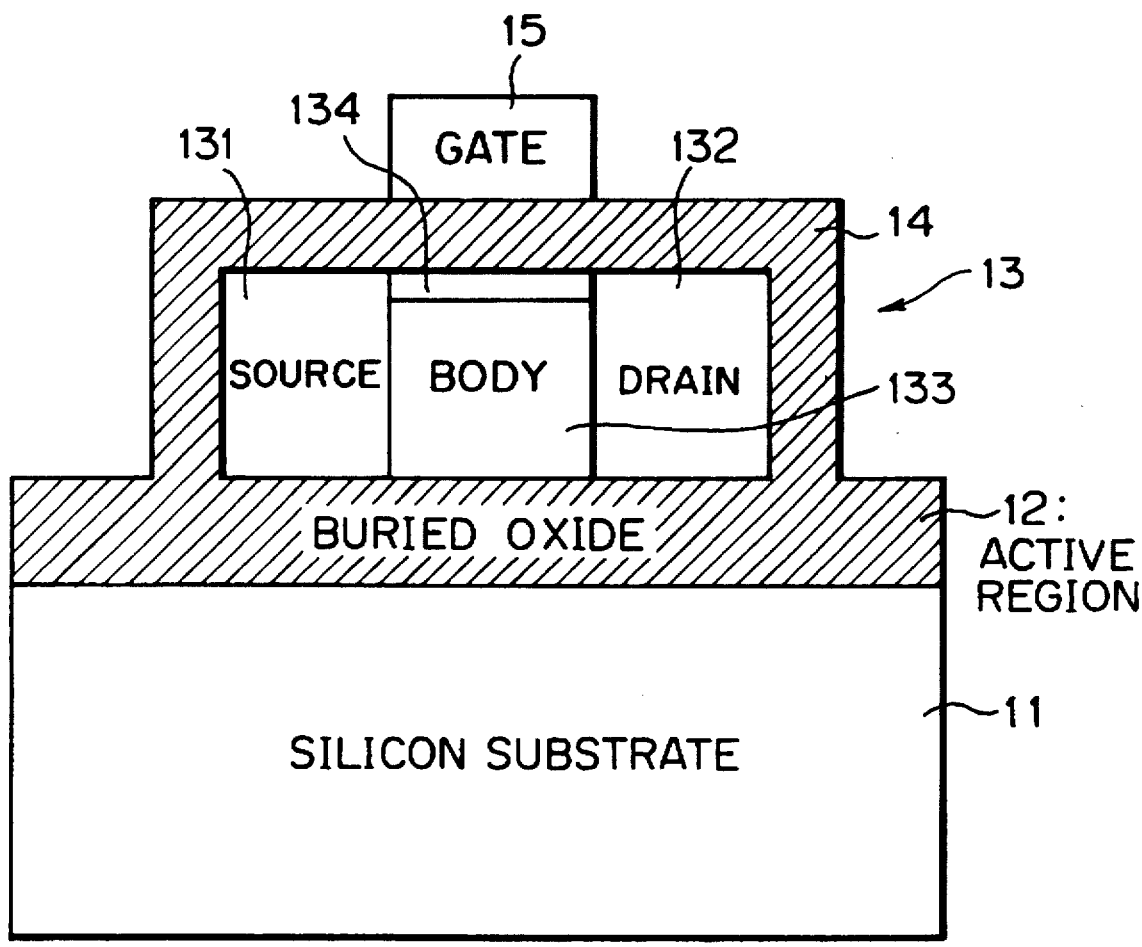
FIG. 2 is a cross-sectional view showing a common structure of a SOI MOSFET.
Figure 3A:
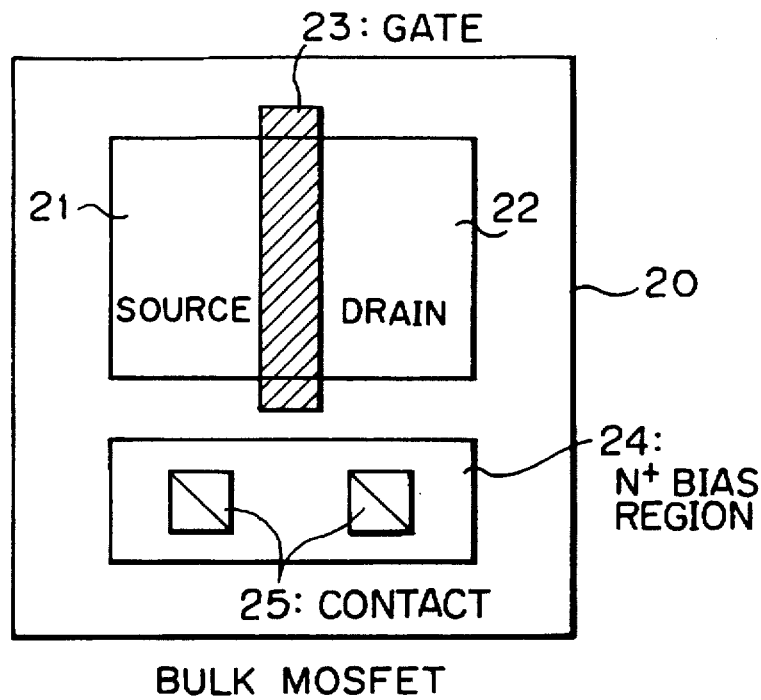
FIG. 3A is a plan view showing a substrate biasing structure of a conventional bulk MOSFET.
Figure 3B:
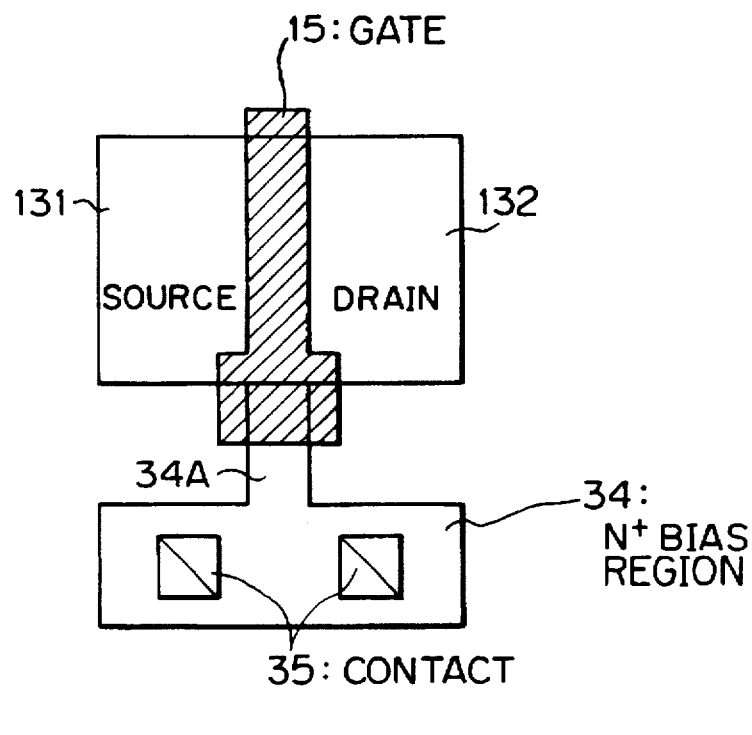
FIG. 3B is a plan view showing a body biasing structure of a conventional SOI MOSFET.
Figure 4:
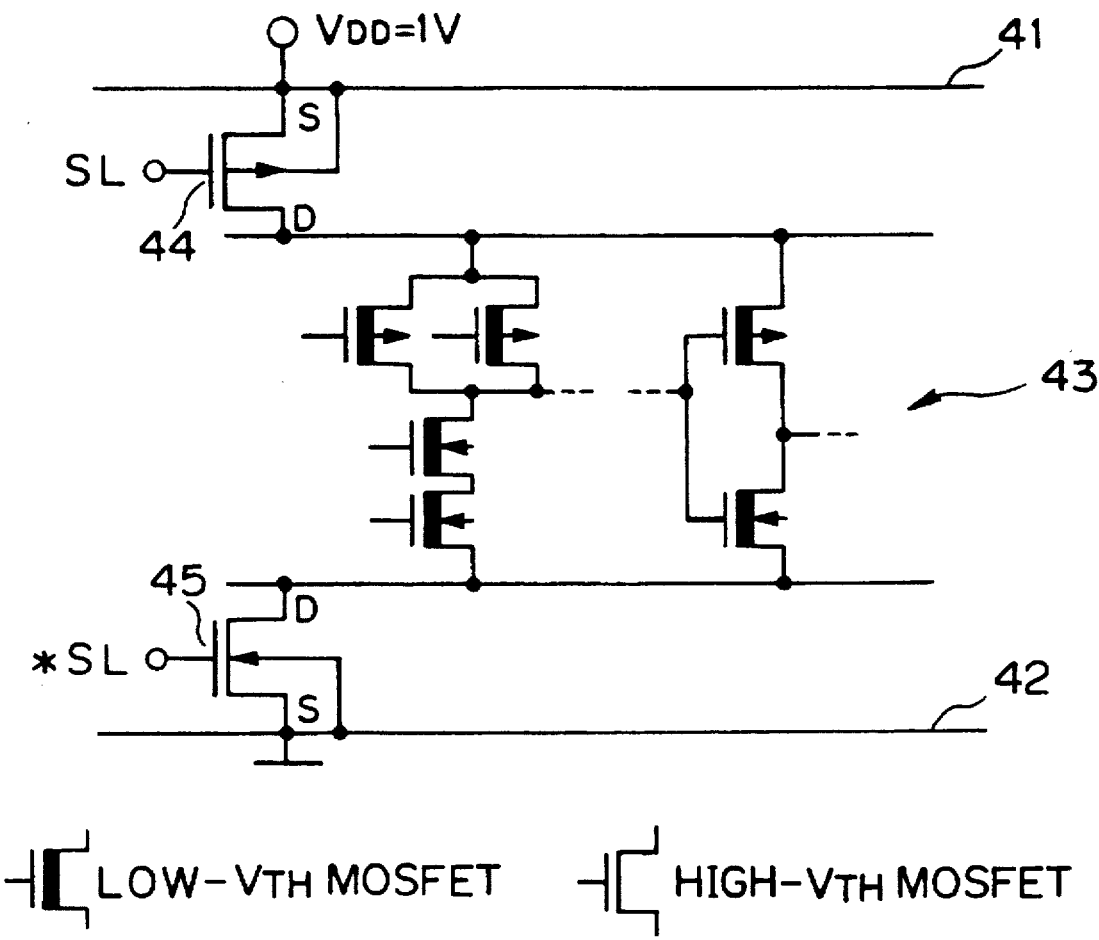
FIG. 4 is a circuit diagram showing the arrangement of a first embodiment of a low voltage SOI logic circuit in accordance with the present invention.

FIG. 4 is a circuit diagram showing the arrangement Of a first embodiment of a low voltage SOI logic circuit in accordance with the present invention.

In this figure, the reference numeral 41 designates a high potential power supply line, and the reference numeral 42 designates a low potential power supply line. The high potential power supply line 41 is connected to the source terminal of a power switching PMOSFET 44, and the low potential power supply line 42 is connected to the source terminal of a power switching NMOSFET 45. The drain of the MOSFET 44 is connected to a high potential terminal of a logic circuit group 43, and the drain of the MOSFET 45 is connected to the low potential terminal of the logic circuit group 43. In other words, the MOSFET 44, the logic circuit group 43, and the MOSFET 45 are connected in cascade so that the power is supplied to the logic circuit group 43 through the MOSFETs 44 and 45. In addition, the gate terminal of the MOSFET 44 is provided with a sleep signal SL, and the gate terminal of the MOSFET 45 is supplied with its inverted signal *SL. These signals are supplied for switching the power switching MOSFETs 44 and 45: They keep the MOSFETs 44 and 45 nonconducting in the sleep mode of the logic circuit group 43, and conducting in the active mode of the logic circuit group 43.

This embodiment is characterized in that the bodies of all the MOSFETs constituting the logic circuit group 43 are set in a floating state. That is, the bodies of these MOSFETs are not biased. In contrast with this, the bodies of the power switching MOSFETs 44 and 45 are biased. Specifically, the body of the MOSFET 44 is connected to the high potential power supply line 41, and the body of the MOSFET 45 is connected to the low potential power supply line 42.

Figure 11:
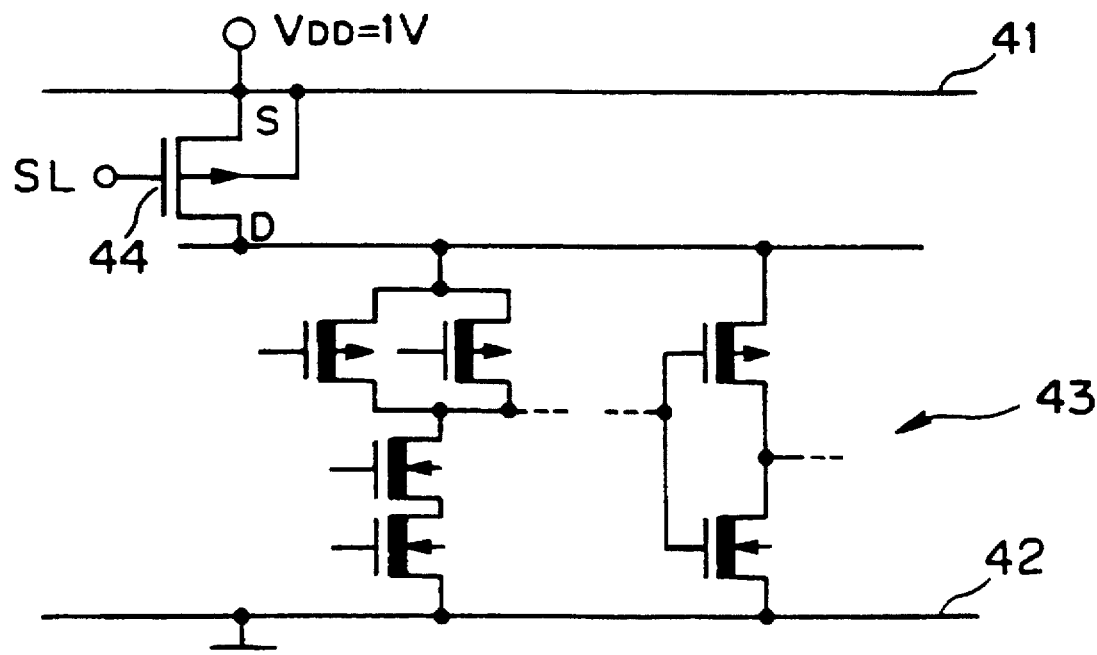
FIGS. 11 and 12 correspond to FIG. 4, but show use of only one power switching SOI FET.

FIG. 11 shows the same circuit diagram as FIG. 4, but of the two power switching MOSFETs 44 and 45, only MOSFET 44 is included in the circuit.

Figure 12:
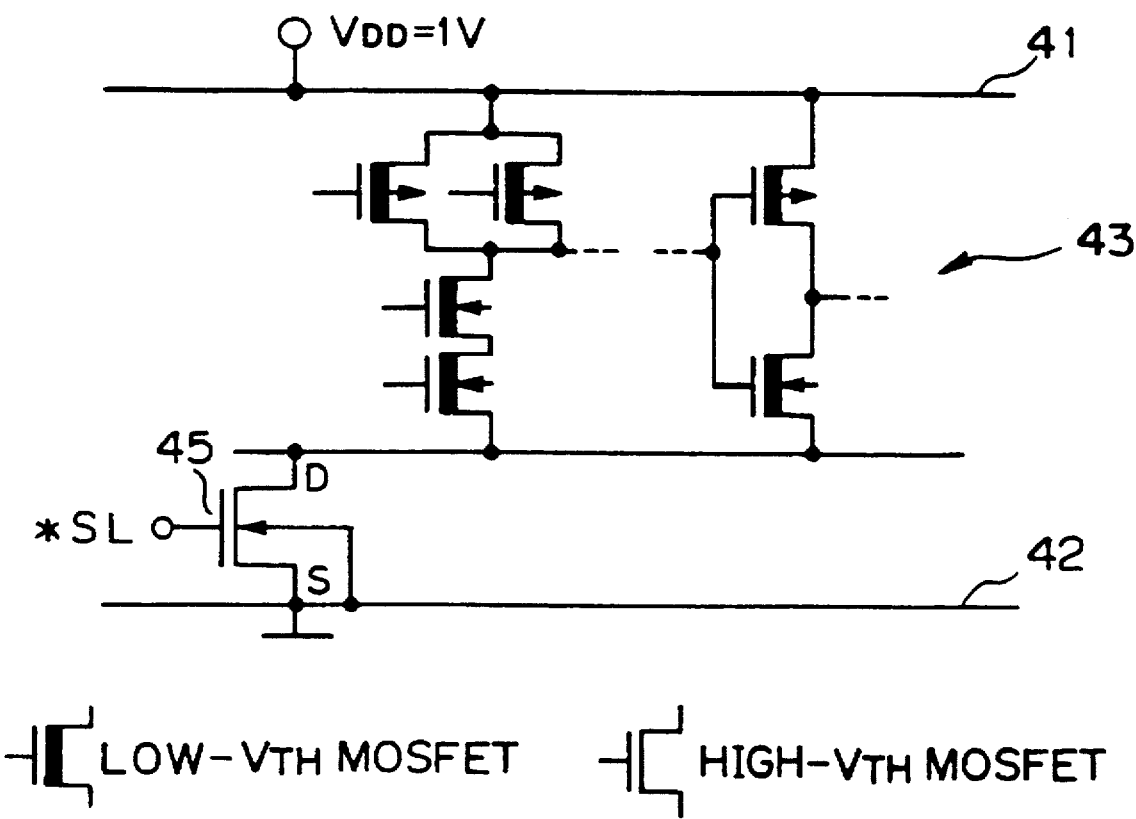

FIG. 12 shows the same circuit diagram as FIG. 4, but of the two power switching MOSFETs 44 and 45, only MOSFET 45 is included in the circuit.

Figure 5A:
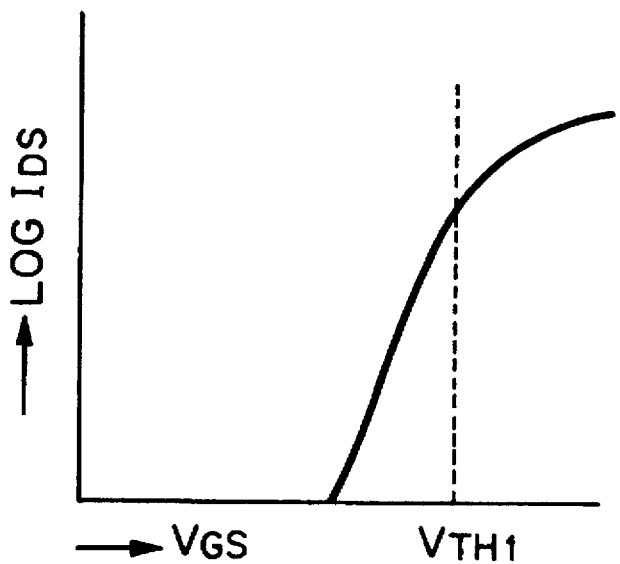
FIG. 5A is a graph illustrating a gate-source voltage versus drain current characteristic and a threshold voltage characteristic when the body of a MOSFET is biased.
Figure 5B:
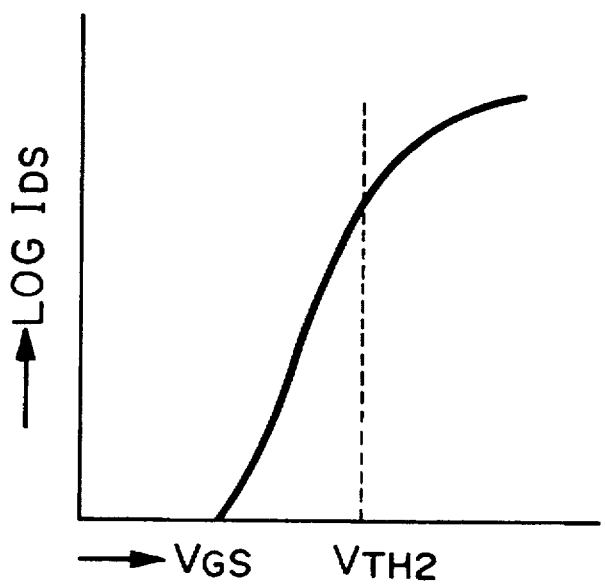
FIG. 5B is a graph illustrating a gate-source voltage versus drain current characteristic and a threshold voltage characteristic when the body of a MOSFET is not biased.

FIGS. 5A and 5B are graphs illustrating the variation in the threshold voltage when the body of the MOSFET is biased and not biased, respectively. The abscissa indicates a gate-source voltage $V_{GS}$, and the ordinate represents a drain current $I_{DS}$ in a logarithmic scale. $V_{TH1}$ and $V_{TH2}$ are threshold voltages. As is clearly shown in these figures, the threshold voltage drops if the body is not biased because of the reason described before. Thus, in terms of the SOI MOSFETs, high threshold MOSFETs and low threshold MOSFETs can be fabricated depending on whether the body is biased or not without using a special mask for adjusting the threshold voltage in the fabrication process.

Furthermore, the present embodiment adjusts the threshold voltage at higher accuracy by controlling the carrier concentration in the bodies. This will be described in detail below.

Figure 6A:
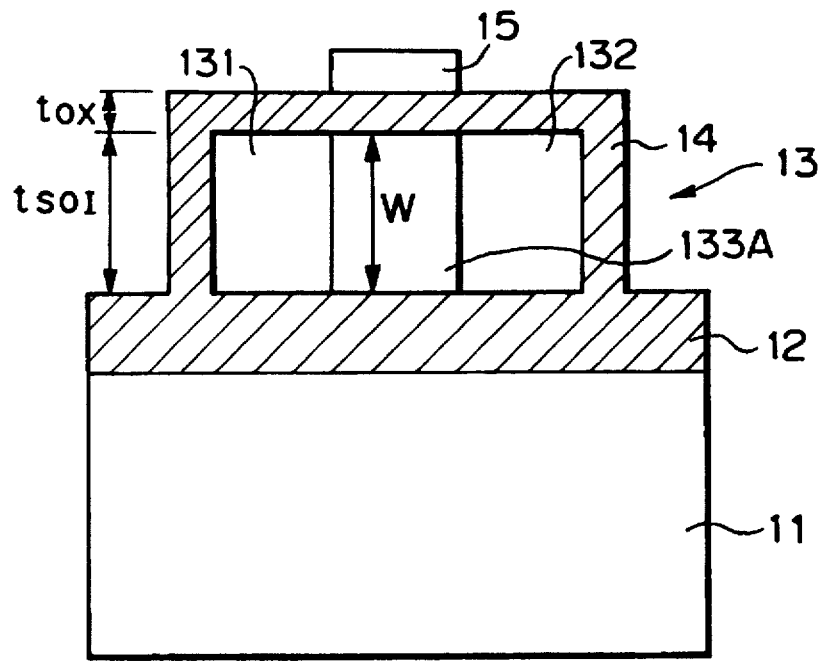
FIG. 6A is a cross-sectional view of a low threshold voltage SOI MOSFET for a logic circuit employed in the first embodiment.
Figure 6B:
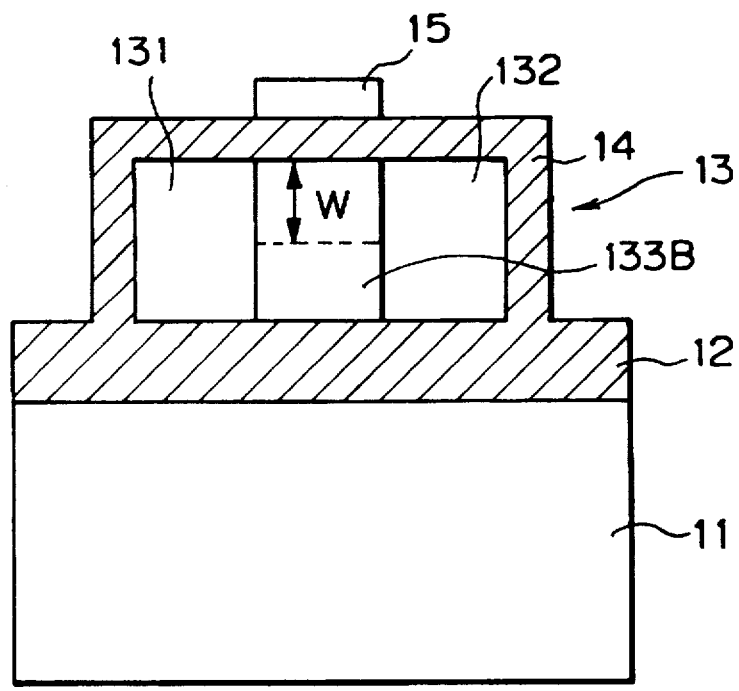
FIG. 6B is a cross-sectional view of a high threshold voltage SOI MOSFET for power switching employed in the first embodiment.

FIG. 6A is a cross-sectional view showing the structure of a MOSFET for the logic circuit group 43, and FIG. 6B is a cross-sectional view showing the structure of the power switching MOSFETs 44 and 45. As is clearly seen from those figures, the body 133A of the MOSFET for the logic circuit group 43 is built such that the depletion layer width W in the body is equal to or greater than the depth of the body. In other words, the body 133A is fully depleted. On the other hand, the body 133B of the power switching MOSFET is built such that the depletion layer width W in the body is less than the depth of the body. That is, the body 133B is partially depleted. Generally speaking, an increase in the depletion layer width will reduce the voltage required to form a channel, and hence, reduce the threshold voltage, as well. Thus, the threshold voltage of the MOSFETs for the logic circuit group is set at a low threshold value at higher accuracy, and the threshold voltage of the power switching MOSFETs is set at a high threshold voltage at higher accuracy. The depletion layer width W of the MOSFETs shown in FIGS. 6A and 6B is given by the following equation.

$$W = \{2\epsilon_{si} \cdot 2\phi_f/(q \cdot N_{body})\}^{1/2} \quad (1)$$

where $\epsilon_{si}$ is the dielectric constant of silicon, $\phi_f$ is the Fermi potential of silicon, q is the charge of the electron, and $N_{body}$ is the carrier concentration in the body. The Fermi potential $\phi_f$ is given by the following equation.

$$\phi_f = (kT/q)\ln(N_{body}/n_i) \quad (2)$$

where k is the Boltzmann constant,

T is the absolute temperature of the body, $n_i$ is the intrinsic carrier concentration of silicon, and ln represents the natural logarithm.

If the depletion layer width W is set equal to or greater than the thickness $t_{SOI}$ of the active region 13, the body 133A will be fully depleted. It is known that the transconductance $g_m$ of the MOSFET increases, its gate capacitance decreases, and the operation speed of the MOSFET increases in this state. The threshold voltage $V_{TH}$ of the MOSFET is given by the following approximation.

$$V_{TH} = V_{FB} + 2\phi_f + (2\epsilon_{si} \cdot 2\phi_f \cdot q \cdot N_{body})^{1/2}/C_{OX} \quad (3)$$

where $V_{FB}$ is the flat-band voltage, and $C_{OX}$ is a capacitance due to the gate oxide 14.

Figure 7:
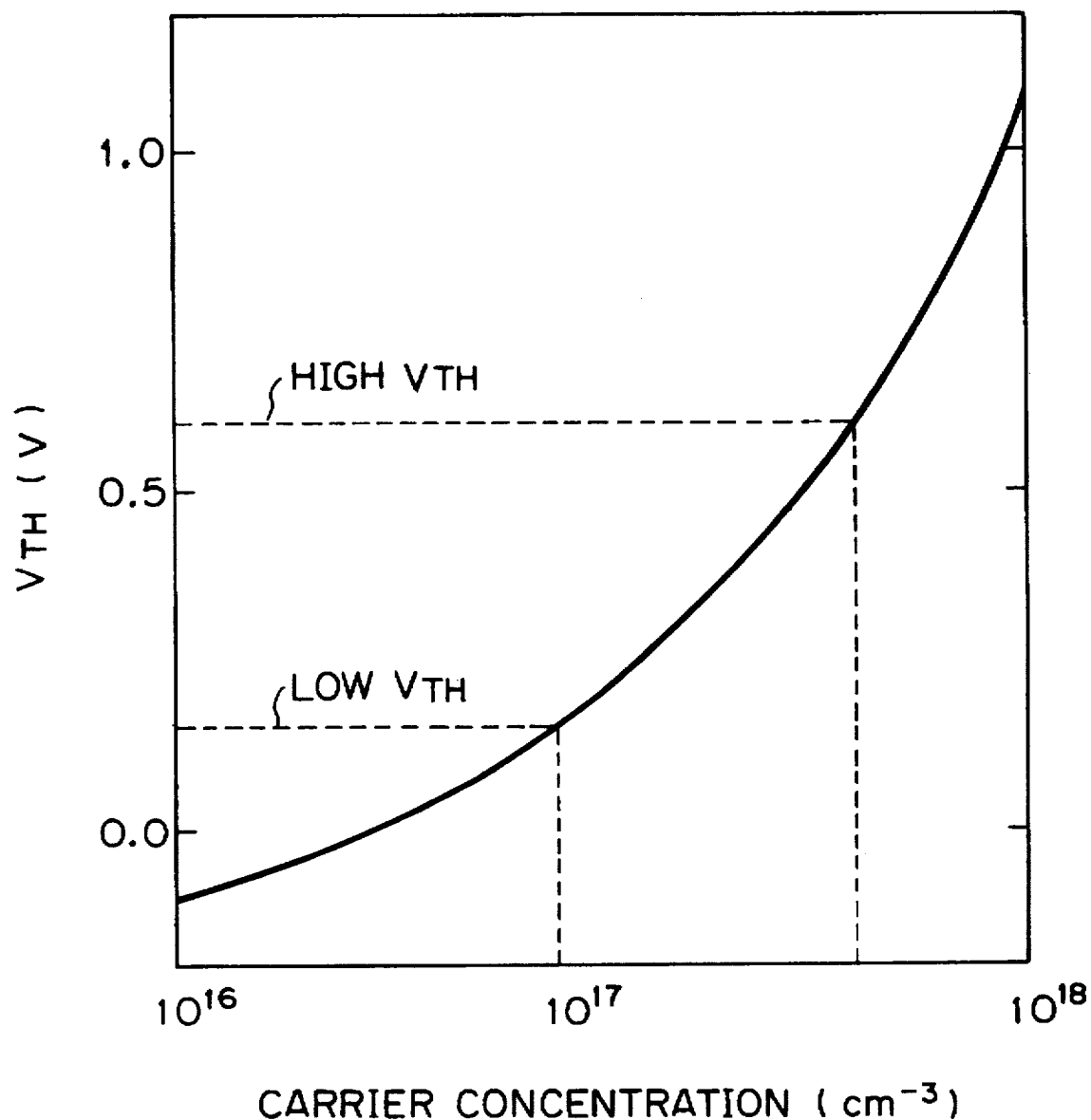
FIG. 7 is a graph illustrating relationships between the carrier concentration of the body and the threshold voltage.

From equations (1)–(3), the fully depleted state of the body 133A of the MOSFETs for the logic circuit can be implemented by setting the thickness $t_{SOI}$ of the active region 13 at 100 nm, the thickness $t_{OX}$ of the gate oxide 14 at 7 nm (in which case, $C_{OX}$=0.49 μF/cm²), and the carrier concentration $N_{body}$ of the body 133A at $8\times10^{16}$ cm⁻³ (in which case, $V_{FB}$=−0.9 V, and $2\phi_f$=+0.8 V). This results in the threshold voltage of approximately 0.2 V as shown in FIG. 7, thereby implementing a low threshold voltage MOSFET. As shown in FIG. 7, the threshold voltage reduces with a decrease in the carrier concentration which results in an increase in the depletion layer width.

Thus, the fully depleted state of the body 133A of the MOSFETs for the logic circuit can be implemented. It is preferable that the carrier concentration $N_{body}$ be set below $1\times10^{17}$ cm⁻³ when the thickness $t_{SOI}$ of the active region 13 is 100 nm.

On the other hand, in the power switching MOSFETs 44 and 45 whose body 133B is biased, the body 133B is partially depleted. For example, the body 133B is partially depleted as shown in FIG. 6B by setting the carrier concentration $N_{body}$ of the body 133B at $4\times10^{17}$ cm⁻³, in which case the depletion layer width W=54 nm. This results in $V_{FB}$=−1.0 V and $2\phi_f$=+0.9 V. Thus, a high threshold voltage MOSFET with a threshold voltage of approximately 0.6 V can be implemented. The thickness $t_{SOI}$ of the active region 13 and the thickness $t_{OX}$ of the gate oxide 14 are set at the same values as those of the MOSFETS for the logic circuit.

It is preferable that the carrier concentration $N_{body}$ of the body 133B be set equal to or greater than $1\times10^{17}$ cm⁻³.

Thus, the bodies 133B of the power switching MOSFETs 44 and 45 are partially depleted. The bodies 133b which are partially depleted are connected to the high potential power supply line 41 and the low potential power supply line 42, respectively. This makes it possible to suppress the variation in the threshold voltage as small as that of the conventional bulk MOSFET. As a result, the variation in the conducting state resistance of the power switching MOSFETs 44 and 45 can be reduced, and hence, a stable power supply voltage can be supplied to the logic circuit group 43.

EMBODIMENT 2

Figure 8:
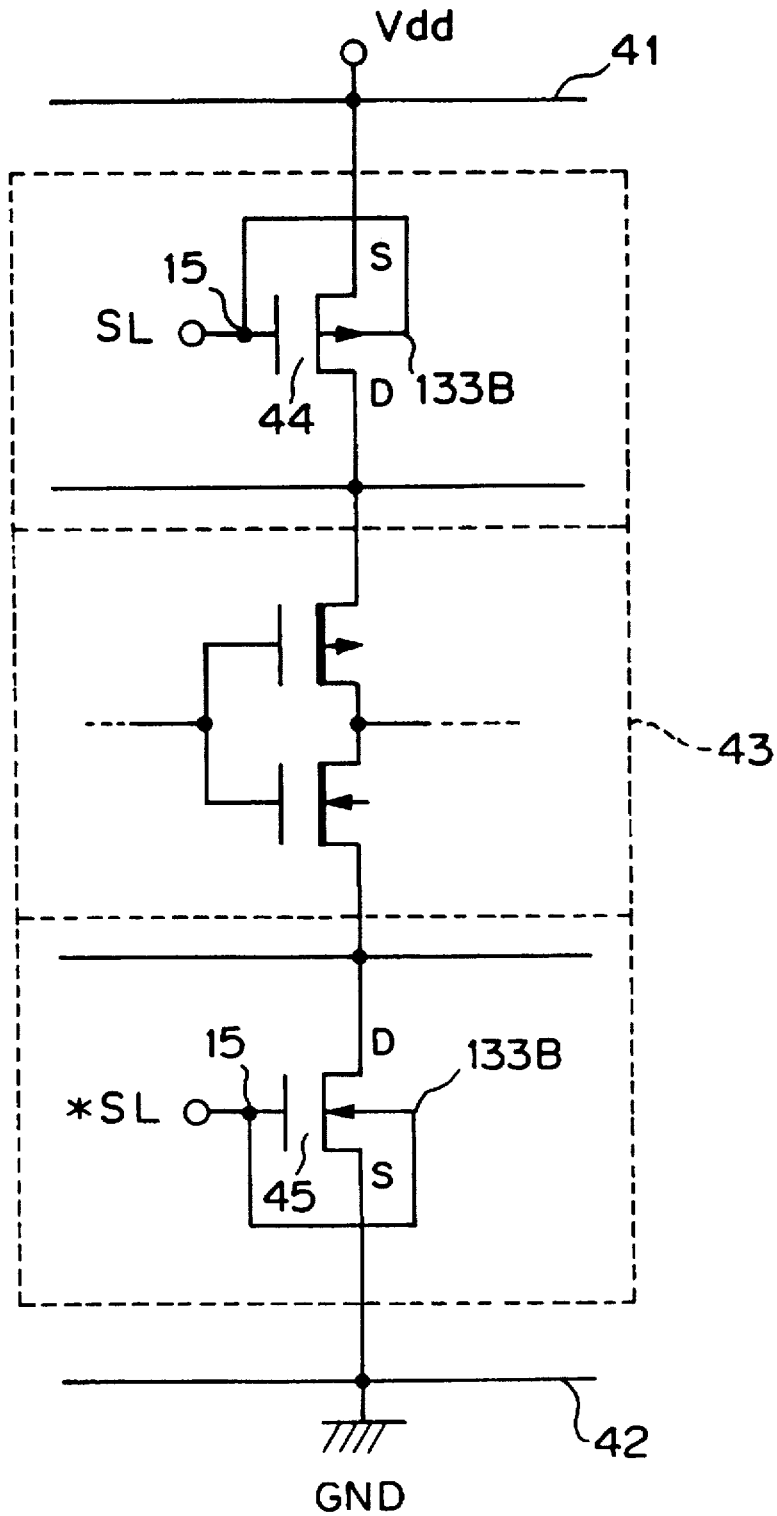
FIG. 8 is a circuit diagram showing the arrangement of a second embodiment of a low voltage SOI logic circuit in accordance with the present invention.

FIG. 8 is a circuit diagram showing the arrangement of a second embodiment of a low voltage SOI logic circuit in accordance with the present invention.

This embodiment differs from the first embodiment in that the bodies 133B of the power switching MOSFETs 44 and 45 are connected to their own gate electrode 15.

With this arrangement, the threshold voltages of the MOSFETs 44 and 45 are increased, and the leakage current is reduced in the sleep mode, whereas the threshold voltages are decreased, and the supply voltage to the logic circuit group 43 is increased in the active mode.

Figure 13:
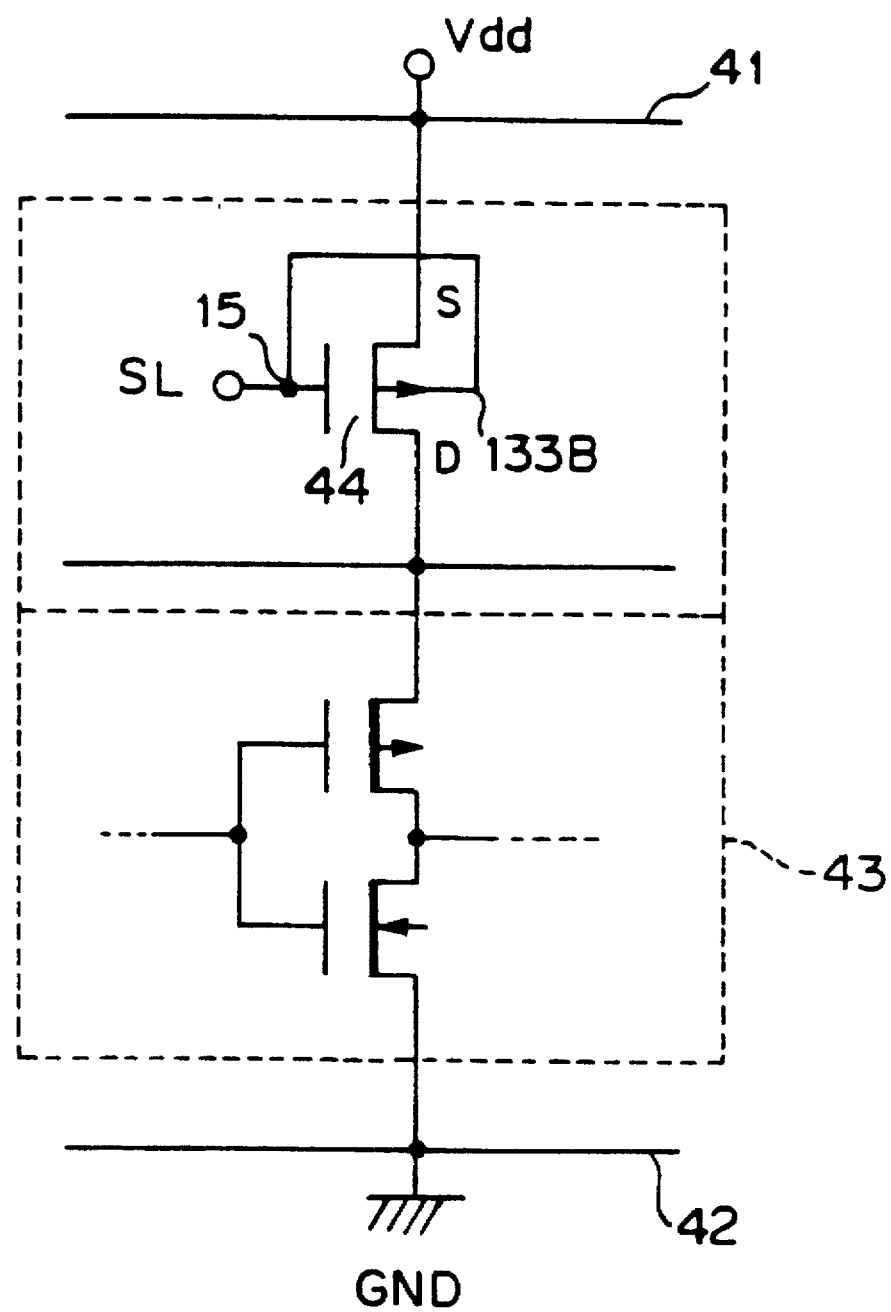
FIGS. 13 and 14 correspond to FIG. 8, but show use of only one power switching SOI FET.

FIG. 13 shows the same circuit diagram as FIG. 8, but of the two MOSFETs 44 and 45, only MOSFET 44 is included in the circuit.

Figure 14:
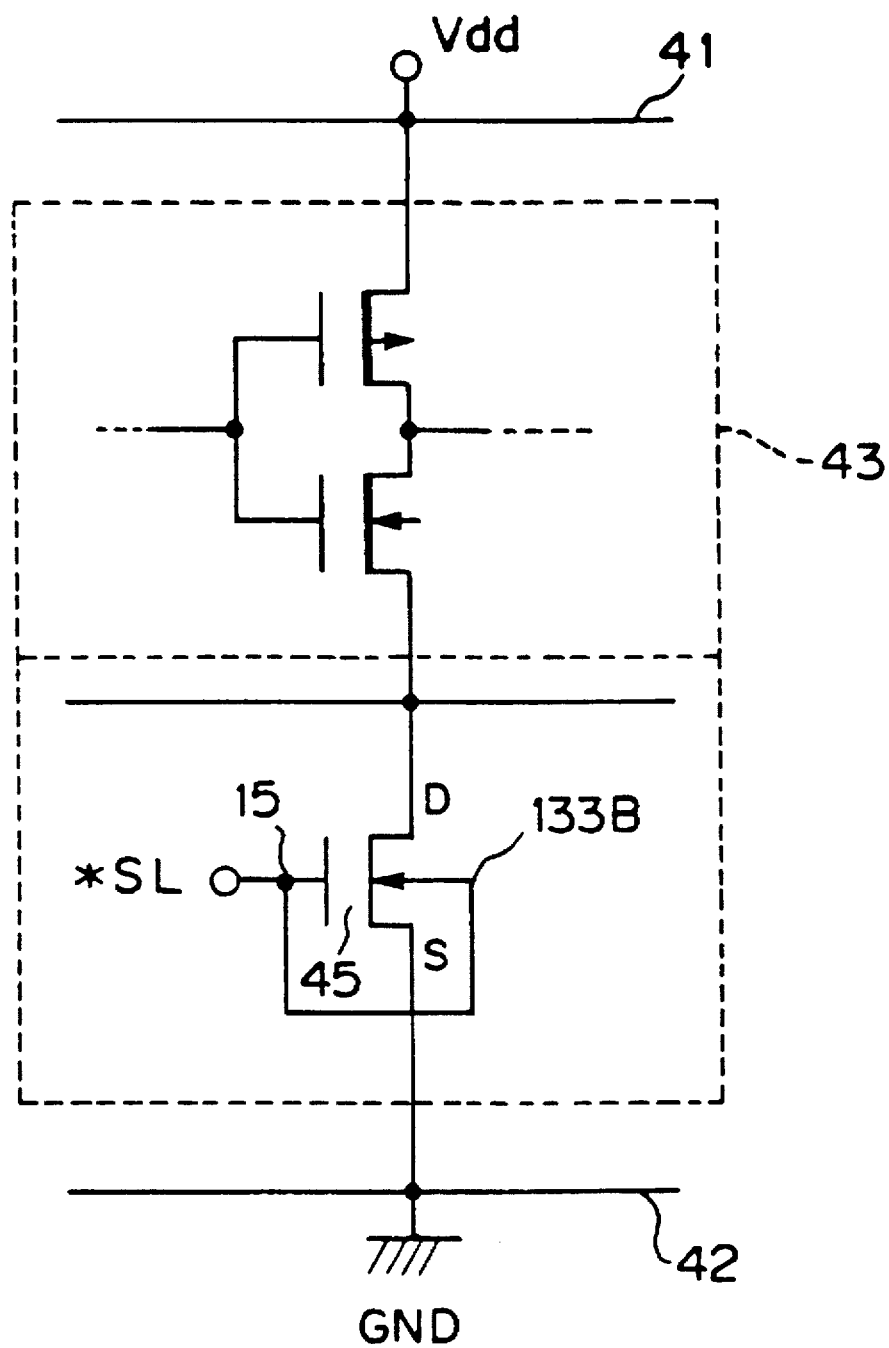

FIG. 14 shows the same circuit diagram as FIG. 8, but of the two MOSFETs 44 and 45, only MOSFET 45 is included in the circuit.

Figure 9A:
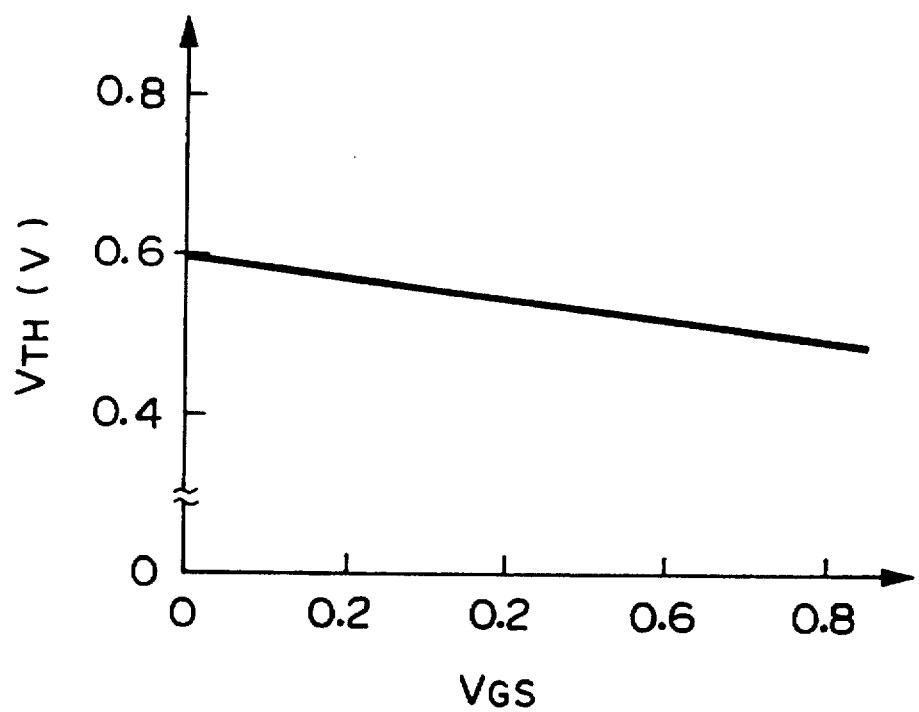
FIG. 9A is a graph illustrating a gate-source voltage versus threshold voltage characteristic when the body of an NMOSFET is connected to the gate electrode.
Figure 9B:
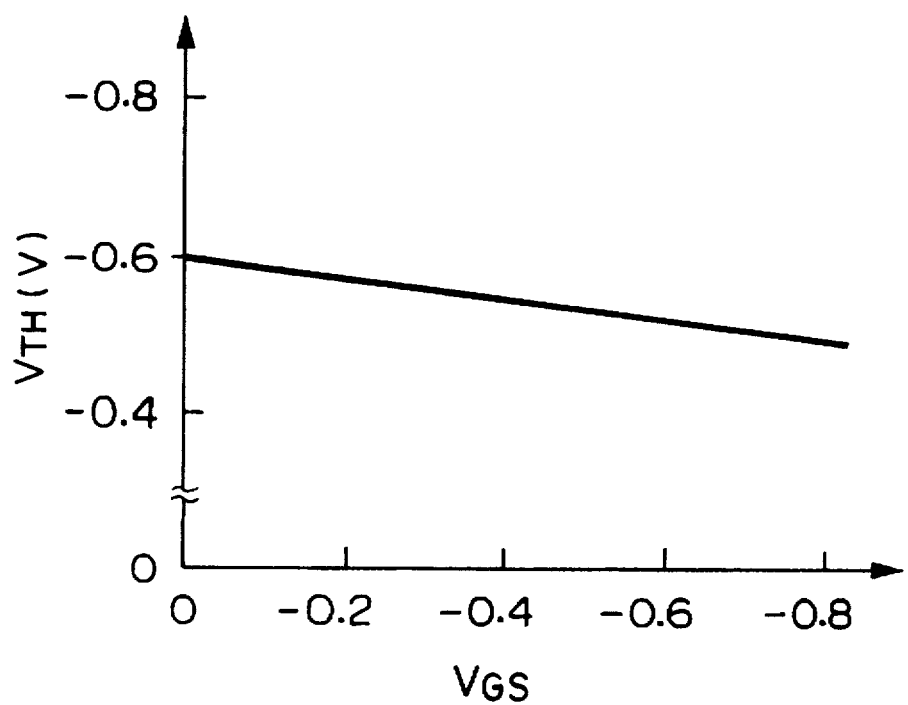
FIG. 9B is a graph illustrating a gate-source voltage versus threshold voltage characteristic when the body of a PMOSFET is connected to the gate electrode.

FIGS. 9A and 9B are graphs illustrating this reason. In these graphs, the abscissa represents the gate-source voltage $V_{GS}$, and the ordinate indicates the threshold voltage $V_{TH}$. As is shown in these figures, the absolute values of the threshold voltages $V_{TH}$ of the MOSFETs decrease with an increase in the absolute values of the gate-source voltages $V_{GS}$. The second embodiment utilizes these characteristics.

First, in the sleep mode, the high level signal SL (1 V) is supplied to the gate of the PMOSFET 44, and the low level signal *SL (0 V) is supplied to the gate of the NMOSFET This makes the gate-source voltages $V_{GS}$ of the PMOSFET 44 and the NMOSFET 45 the low voltage (0 V), thereby increasing the threshold voltage $V_{TH}$.

On the other hand, in the active mode, the low level signal SL (0 V) is supplied to the gate of the PMOSFET 44, and the high level signal *SL (1 V) is supplied to the gate of the NMOSFET 45. This makes the gate-source voltage $V_{GS}$ of the PMOSFET 44 and NMOSFET 45 the high voltage (1 V), thereby decreasing the threshold voltage $V_{TH}$.

As a result, the leakage current can be suppressed at a low value in the sleep mode because of the increased nonconducting state resistance of the MOSFETs 44 and 45, and the supply voltage to the logic circuit group 43 can be increased in the active mode owing to the reduced conducting state resistance of the MOSFETs 44 and 45.

Although the power switching MOSFETs are provided for both the high potential side and the low potential side in the foregoing embodiments, a nearly similar effect and advantages can be achieved by providing only one power switching MOSFET to either the high potential side or the low potential side. For example, when the MOSFET 45 at the low potential side is removed, the low potential terminal of the logic circuit group 43 can be directly connected to the low potential power supply line 42.

Figure 10:
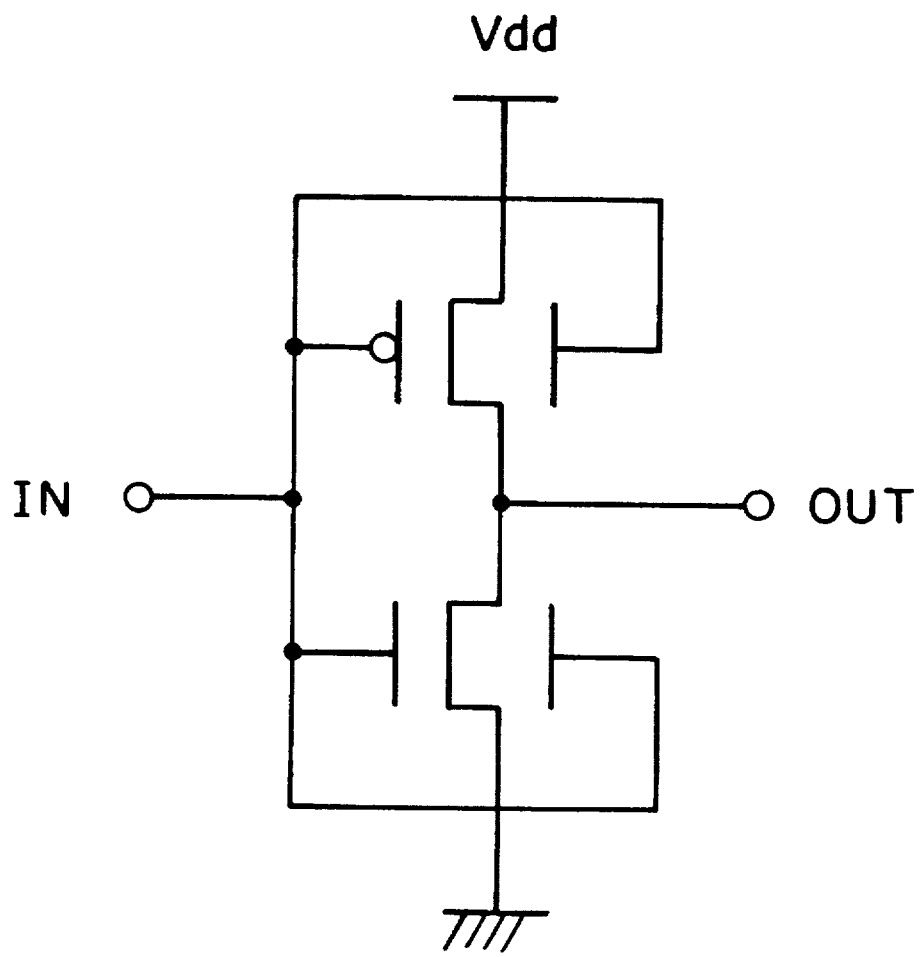
FIG. 10 is a circuit diagram showing a conventional circuit with an arrangement partially similar to the second embodiment.

FIG. 10 shows a conventional technique, in which the bodies of MOSFETs constituting a logic circuit are each connected to their respective gate electrodes. This technique ms disclosed in T. Andoh, et al, "Design Methodology for Low-Voltage MOSFETs", 1994, IEEE, pp. 79–82. The present embodiment differs from this conventional technique in that although the conventional technique employs the MOSFETs with their bodies connected to the gate electrodes as logic circuit elements, the present invention uses such MOSFETs only as the power switching MOSFETs. Since the MOSFETs with their bodies connected to the gate electrodes must be provided with connecting portions between the bodies and the gate electrodes, the occupied area and the input capacitance of the device increase as compared with those of the MOSFETs with their bodies floating. This will reduces the operation speed, and hence, the MOSFETs with their bodies connected to the gate electrodes are unsuitable for the logic circuit. The present invention can avoid such adverse effect because such MOSFETs are only used as the power switching elements which demand lower operation speed and lower used number than those of the MOSFETs for the logic circuit.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A low voltage SOI (Silicon On Insulator) logic circuit comprising:

a first power supply line;

a second power supply line;

a first SOI FET (Field Effect Transistor) whose source and body are connected to said first power supply line;

a second SOI FET whose source and body are connected to said second power supply line; and a logic circuit connected between a drain of said first SOI FET and a drain of said second SOI FET;

wherein said logic circuit is constituted by a plurality of SOI FETs whose bodies are made floating state, and a connection between said first power supply line ahd said logic circuit and a connection between said second power supply line and said logic circuit are switched by a signal supplied to a gate of said first SOI FET and a gate of said second SOI FET.

2. The low voltage SOI logic circuit as claimed in claim 1, wherein a carrier concentration in said bodies of said SOI FETs constituting said logic circuit is adjusted such that said bodies of said SOI FETs constituting said logic circuit are made fully depleted, and a carrier concentration in said bodies of said first SOI FET and said second SOI FET is adjusted such that said bodies of said first SOI FET and said second SOI FET are partially depleted.

3. The low voltage SOI logic circuit as claimed in claim 1, wherein a carrier concentration in said bodies of said SOI FETs constituting said logic circuit is adjusted such that a depletion layer width W given by the following equation (A) is equal to or greater than depth of said bodies of said SOI FETs constituting said logic circuit, and a carrier concentration in said bodies of said first SOI FET and said second SOI FET are adjusted such that said depletion layer width W given by the following equation (A) is less than depth of said bodies of said first SOI FET and said second SOI FET:

$$W=\{2\epsilon_{si} 2\phi_f/(q \cdot N_{body})\}^{1/2} \quad (A)$$

where $\epsilon_{si}$ is the dielectric constant of silicon, $\phi_f$ is the Fermi potential of silicon, q is the charge of the electron, and $N_{body}$ is the carrier concentration in the body.

4. The low voltage SOI logic circuit as claimed in claim 3, wherein said depth of said bodies of said SOI FETs constituting said logic circuit is made equal to or less than 100 nm, and said carrier concentration in said bodies of said SOI FETs constituting said logic circuit is made equal to or less than $1 \times 10^{17}$ cm$^{-3}$ to fully deplete said bodies, and said depth of said bodies of said first SOI FET and said second SOI FET is made equal to or less than 100 nm, and said carrier concentration in said bodies of said first SOI FET and said second SOI FET is set greater than $1 \times 10^{17}$ cm$^{-3}$ to partially deplete said bodies.

5. A low voltage SOI (Silicon On Insulator) logic circuit comprising:

a first power supply line;

a second power supply line;

a first SOI FET (Field Effect Transistor) whose source is connected to said first power supply line, and whose body is connected to a gate of said first SOI FET;

a second SOI FET whose source is connected to said second power supply line, and whose body is connected to a gate of said second SOI FET; and a logic circuit connected between a drain of said first SOI FET and a drain of said second SOI FET;

wherein said logic circuit is constituted by a plurality of SOI FETs whose bodies are made floating state, and a connection between said first power supply line and said logic circuit and a connection between said second power supply line and said logic circuit are switched by a signal supplied to said gate of said first SOI FET and said gate of said second SOI FET.

6. The low voltage SOI logic circuit as claimed in claim 5, wherein a carrier concentration in said bodies of said SOI FETs constituting said logic circuit is adjusted such that said bodies of said SOI FETs constituting said logic circuit are made fully depleted, and a carrier concentration in said bodies of said first SOI FET and said second SOI FET is adjusted such that said bodies of said first SOI FET and said second SOI FET are partially depleted.

7. The low voltage SOI logic circuit as claimed in claim 5, wherein a carrier concentration in said bodies of said SOI FETs constituting said logic circuit is adjusted such that a depletion layer width W given by the following equation (A) is equal to or greater than depth of said bodies of said SOI FETs constituting said logic circuit, and a carrier concentration in said bodies of said first SOI FET and said second SOI FET are adjusted such that said depletion layer width W given by the following equation (A) is less than depth of said bodies of said first SOI FET and said second SOI FET:

$$W=\{2\epsilon_{si} 2\phi_f/(q \cdot N_{body})\}^{1/2} \quad (A)$$

where $\epsilon_{si}$ is the dielectric constant of silicon, $\phi_f$ is the Fermi potential of silicon, q is the charge of the electron, and $N_{body}$ is the carrier concentration in the body.

8. The low voltage SOI logic circuit as claimed in claim 7, wherein said depth of said bodies of said SOI FETs constituting said logic circuit is made equal to or less than 100 nm, and said carrier concentration in said bodies of said SOI FETs constituting said logic circuit is made equal to or less than $1\times10^{17}$ cm$^{-3}$ to fully deplete said bodies, and said depth of said bodies of said first SOI FET and said second SOI FET is made equal to or less than 100 nm, and said carrier concentration in said bodies of said first SOI FET and said second SOI FET is set greater than $1\times10^{17}$ cm$^{-3}$ to partially deplete said bodies.

9. A low voltage SOI (Silicon On Insulator) logic circuit comprising:

a first power supply line;

a second power supply line;

a power switching SOI FET (Field Effect Transistor) whose source and body are connected to said first power supply line; and a logic circuit connected between a drain of said power switching SOI FET and said second power supply line;

wherein said logic circuit is constituted by a plurality of SOI FETs whose bodies are made floating state, and a connection between said first power supply line and said logic circuit is switched by a signal supplied to a gate of said power switching SOI FET.

10. The low voltage SOI logic circuit as claimed in claim 9, wherein a carrier concentration in said bodies of said SOI FETs constituting said logic circuit is adjusted such that said bodies of said SOI FETs constituting said logic circuit are made fully depleted, and a carrier concentration in said body of said power switching SOI FET is adjusted such that said body of said power switching SOI FET is partially depleted.

11. The low voltage SOI logic circuit as claimed in claim 9, wherein a carrier concentration in said bodies of said SOI FETs constituting said logic circuit is adjusted such that a depletion layer width W given by the following equation (A) is equal to or greater than depth of said bodies of said SOI FETs constituting said logic circuit, and a carrier concentration in said body of said power switching SOI FET is adjusted such that said depletion layer width W given by the following equation (A) is less than depth of said body of said power switching SOI FET:

$$W=\{2\epsilon_{si}\cdot 2\phi_f/(q\cdot N_{body})\}^{1/2} \quad (A)$$

where $\epsilon_{si}$ is the dielectric constant of silicon, $\phi_f$ is the Fermi potential of silicon, q is the charge of the electron, and $N_{body}$ is the carrier concentration in the body.

12. The low voltage SOI logic circuit as claimed in claim 11, wherein said depth of said bodies of said SOI FETs constituting said logic circuit is made equal to or less than 100 nm, and said carrier concentration in said bodies of said SOI FETs constituting said logic circuit is made equal to or less than $1\times10^{17}$ cm$^{-3}$ to fully deplete said bodies, and said depth of said body of said power switching SOI FET is made equal to or less than 100 nm, and said carrier concentration of said body of said power switching SOI FET is set greater than $1\times10^{17}$ cm$^{-3}$ to partially deplete said body.

13. A low voltage SOI (Silicon On Insulator) logic circuit comprising:

a first power supply line;

a second power supply line;

a power switching SOI FET (Field Effect Transistor) whose source is connected to said first power supply line, and whose body is connected to a gate of said power switching SOI FET; and a logic circuit connected between a drain of said power switching SOI FET and said second power supply line;

wherein said logic circuit is constituted by a plurality of SOI FETs whose bodies are made floating state, and a connection between said first power supply line and said logic circuit is switched by a signal supplied to said gate of said power switching SOI FET.

14. The low voltage SOI logic circuit as claimed in claim 13, wherein a carrier concentration in said bodies of said SOI FETs constituting said logic circuit is adjusted such that said bodies of said SOI FETs constituting said logic circuit are made fully depleted, and a carrier concentration in said body of said power switching SOI FET is adjusted such that said body of said power switching SOI FET is partially depleted.

15. The low voltage SOI logic circuit as claimed in claim 13, wherein a carrier concentration in said bodies of said SOI FETs constituting said logic circuit is adjusted such that a depletion layer width W given by the following equation (A) is equal to or greater than depth of said bodies of said SOI FETs constituting said logic circuit, and a carrier concentration in said body of said power switching SOI FET is adjusted such that said depletion layer width W given by the following equation (A) is less than depth of said body of said power switching SOI FET:

$$W=\{2\epsilon_{si}\cdot 2\phi_f/(q\cdot N_{body})\}^{1/2} \quad (A)$$

where $\epsilon_{si}$ is the dielectric constant of silicon, $\phi_f$ is the Fermi potential of silicon, q is the charge of the electron, and $N_{body}$ is the carrier concentration in the body.

16. The low voltage SOI logic circuit as claimed in claim 15, wherein said depth of said bodies of said SOI FETs constituting said logic circuit is made equal to or less than 100 nm, and said carrier concentration in said bodies of said SOI FETs constituting said logic circuit is made equal to or less than $1\times10^{17}$ cm$^{-3}$ to fully deplete said bodies, and said depth of said body of said power switching SOI FET is made equal to or less than 100 nm, and said carrier concentration of said body of said power switching SOI FET is set greater than $1\times10^{17}$ cm$^{-3}$ to partially deplete said body.

\* \* \* \* \*

UNITED STATES PATENT AND TRADEMARK OFFICE
CERTIFICATE OF CORRECTION

PATENT NO.  : 5,594,371
DATED       : January 14, 1997
INVENTOR(S) : DOUSEKI

It is certified that error appears in the above-indentified patent and that said Letters Patent is hereby corrected as shown below:

itle page, Item [56] References Cited, under "U.S. PATENT DOCUMENTS", line 2, 4,906,587  7/1988  Blake" should be --4,906,587  3/1990  Blake--.

Signed and Sealed this

Fifth Day of August, 1997

Attest:

BRUCE LEHMAN

Attesting Officer

Commissioner of Patents and Trademarks